United States Patent [19]
Van Buskirk

[11] Patent Number: 5,142,496
[45] Date of Patent: Aug. 25, 1992

[54] METHOD FOR MEASURING $V_T$'S LESS THAN ZERO WITHOUT APPLYING NEGATIVE VOLTAGES

[75] Inventor: Michael A. Van Buskirk, San Jose, Calif.

[73] Assignee: Advanced Micro Devices, Inc., Sunnyvale, Calif.

[21] Appl. No.: 709,525

[22] Filed: Jun. 3, 1991

[51] Int. Cl.⁵ .............................................. G11C 29/00
[52] U.S. Cl. ........................ 365/201; 365/185; 365/104; 365/208; 365/210; 365/218
[58] Field of Search ............... 365/104, 201, 207, 208, 365/185, 210, 218

[56] References Cited

U.S. PATENT DOCUMENTS

| | | | |
|---|---|---|---|
| 4,541,077 | 9/1985 | Rapp | 365/210 |
| 4,611,301 | 9/1986 | Iwahashi et al. | 365/104 |
| 4,636,664 | 1/1987 | Craycraft et al. | 365/208 |
| 4,692,902 | 9/1987 | Tanaka et al. | 365/210 |
| 4,802,166 | 1/1989 | Casagrande et al. | 365/201 |
| 4,817,052 | 3/1989 | Shinoda et al. | 365/104 |
| 4,839,860 | 6/1989 | Shinoda et al. | 365/210 |
| 4,841,482 | 6/1989 | Kreifels et al. | 365/218 |
| 4,860,261 | 8/1989 | Kreifels et al. | 365/201 |
| 4,912,674 | 3/1990 | Matsumoto et al. | 365/104 |
| 4,937,787 | 6/1990 | Kobatake | 365/201 |
| 4,943,948 | 7/1990 | Morton et al. | 365/201 |
| 4,974,207 | 11/1990 | Hashimoto | 365/210 |
| 5,053,998 | 10/1991 | Kannan et al. | 365/208 |

Primary Examiner—Joseph E. Clawson, Jr.
Attorney, Agent, or Firm—Davis Chin

[57] ABSTRACT

A test logic circuit structure for performing a measurement operation on a semiconductor memory circuit device without requiring a negative supply voltage is provided which includes a comparator (38), a first resistive network (37) operatively connected to a first input of the comparator, and a second resistive network (35) operatively connected to a second input of the comparator. Verify logic circuitry (40) is used to switch the ratio of the value of the first resistive network to the value of the second resistive network defining a sense ratio to be less than one during a floor test mode so as to permit measurement of the threshold voltage of a programming array transistor ($Q_P$) which is less than the threshold voltage of a reference cell transistor ($Q_R$).

20 Claims, 6 Drawing Sheets

METHOD FOR MEASURING $V_T$'S LESS THAN ZERO WITHOUT APPLYING NEGATIVE VOLTAGES

BACKGROUND OF THE INVENTION

This invention relates generally to semiconductor integrated circuit memory devices and more particularly, it relates to a semiconductor integrated circuit memory device having a test logic circuit structure for performing a measurement operation on memory arrays of the semiconductor memory circuit device. Specifically, the present invention is directed to a test logic circuit structure used in a semiconductor memory of an erasable programmable read-only memory (EPROM) or electrically erasable programmable read-only memory (EEPROM or E²PROM) type for measuring the threshold of an array cell which is less than zero or is less than the threshold of a reference cell without requiring the use of negative supply potentials.

In recent years, the semiconductor integrated circuit memory devices, especially MOS integrated circuits utilizing MOS transistors, are becoming more and more microminiaturized by reducing the size of the memory cell transistors and thus the memory chips so as to increase the memory capacity for a given chip area. The bit density for such memory devices having a high memory capacity in the last few years has reached IM bits on the memory chips now in production. This has been achieved usually through the fabrication of the depth of the source and drain regions of the MOS transistors to be shallower or by decreasing the length of the gate region. The thickness of the gate insulation film is also reduced. As a result of the scaling of the MOS transistor devices, the parametric variations from transistor device to transistor device may tend to increase. This would certainly be the case when considering the parametric variations occurring in the number of transistors in large memory arrays. Insulation film thickness variations (physical), line width variations and defects could easily be attributed to these parametric variations.

With these physical variations, the programming and erasing characteristics of an EEPROM or more specifically a single transistor Flash EPROM (Flash EEPROM) can vary from transistor device to transistor device in the same memory array. For the single transistor Flash EPROM, it is particularly important to maintain tight control over the threshold voltage distributions of erased cells. It is also important to maintain the threshold voltages of all erased cells to be greater than zero. If the threshold voltage $V_T$ of the cell on a given column (bit line) becomes less than zero, then there will be column leakage thereby rendering the cells in this column increasingly more difficult to program. Under this condition, there is brought about a disadvantage that the data programming characteristic of the memory cell is deteriorated so as to cause endurance failures. Consequently, the number of times that the memory cell may be re-programmed is significantly reduced.

As is generally known, a positive power source voltage, typically +5.0 volts, is applied to the gate of the MOS transistor of the selected memory cell and the non-selected memory cell is provided with a gate voltage of zero volts. However, when the threshold voltage drops abnormally to a negative value the memory cell not selected will be rendered conductive. In order to turn- o off the MOS transistor having the negative threshold, a negative power source voltage is required.

It is generally undesirable to use negative power source voltages for the MOS integrated circuits from a practical design point of view.

In order to fabricate memory devices of the EPROM or EEPROM type with a high yield which have a large memory capacity (IM bits) and a high reliability (i.e., does not have endurance failures caused by negative thresholds), there has arisen a need to provide a test logic circuit structure for measuring the threshold voltages of each memory cell transistor in the memory device to determine if it is negative without requiring a negative supply voltage, thereby enhancing its production yield. Therefore, it is important to verify the threshold voltages of the memory cell transistors so as to avoid causing the entire chip to be usable due to a single flaw in its fabrication. In the event that memory cell transistors are found to have negative thresholds, such defective memory cells can be replaced by a redundancy circuity which can be easily implemented by those skilled in the art. In view of the large number of memory cells on the single memory chip that must be tested, it would be expedient that the test logic circuit structure be capable of operating at a very high speed.

SUMMARY OF THE INVENTION

Accordingly, it is a general object of the present invention to provide a semiconductor integrated circuit memory device having a test logic circuit structure for performing a measurement operation on memory arrays of the semiconductor memory circuit device on an efficient and effective basis.

It is an object of the present invention to provide a test logic circuit structure used in a semiconductor memory of an EPROM or EEPROM type for measuring the threshold of an array cell which is less than the threshold of a reference cell without requiring the use of negative supply potentials.

It is another object of the present invention to provide a test logic circuit structure for performing a measurement on a semiconductor memory device which includes verify logic circuitry for placing a cell matrix in a floor test mode, the verify logic circuitry switching a sense ratio to be less than one so as to permit measurement of the threshold voltages of programming array transistors which are less than the threshold voltages of reference cell transistors.

It is still another object of the present invention to provide a test logic circuit structure which includes a first resistive network, a second resistive network, and verify logic circuitry for switching the ratio of the values of the first resistance network to the second resistive network to be less than one so as to permit a measurement operation to be performed on memory arrays of semiconductor memory circuit device.

In accordance with these aims and objectives, the present invention is concerned with the provision of a semiconductor memory circuit device having a test logic structure for performing a measurement on the memory circuit device without requiring a negative supply potential. The test logic structure includes a cell matrix having a plurality of memory cells arranged in rows of word lines and columns of bit lines intersecting the rows of word lines. Each of the memory cells includes a programming array transistor having an array threshold voltage. A row decoder is responsive to row address signals and is operatively connected to the cell matrix for selecting one of the rows of word lines. A column decoder is responsive to column address signals and is operatively connected to the cell matrix for selecting one of the columns of bit lines. A reference column having a plurality of reference cells is arranged in rows of word lines corresponding to the number of rows in the cell matrix. Each of the reference cells includes a reference cell transistor having a reference threshold voltage.

The test logic structure further includes Y-pass gates operatively connected to the columns of bit lines and a sense amplifier operatively connected to the Y-pass gates. A first resistive network is operatively connected to the selected column of bit lines and to a first input of the sense amplifier. A second resistive network is operatively connected to a reference column bit line and to second input of the sense amplifier. Verify logic circuitry is provided for switching the ratio of the values of the first resistive network to the second resistive network defining a sense ratio to be less than one during a floor test mode so as to permit measurement of the threshold voltages of the programming array transistors which are less than the threshold voltages of the reference cell transistors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
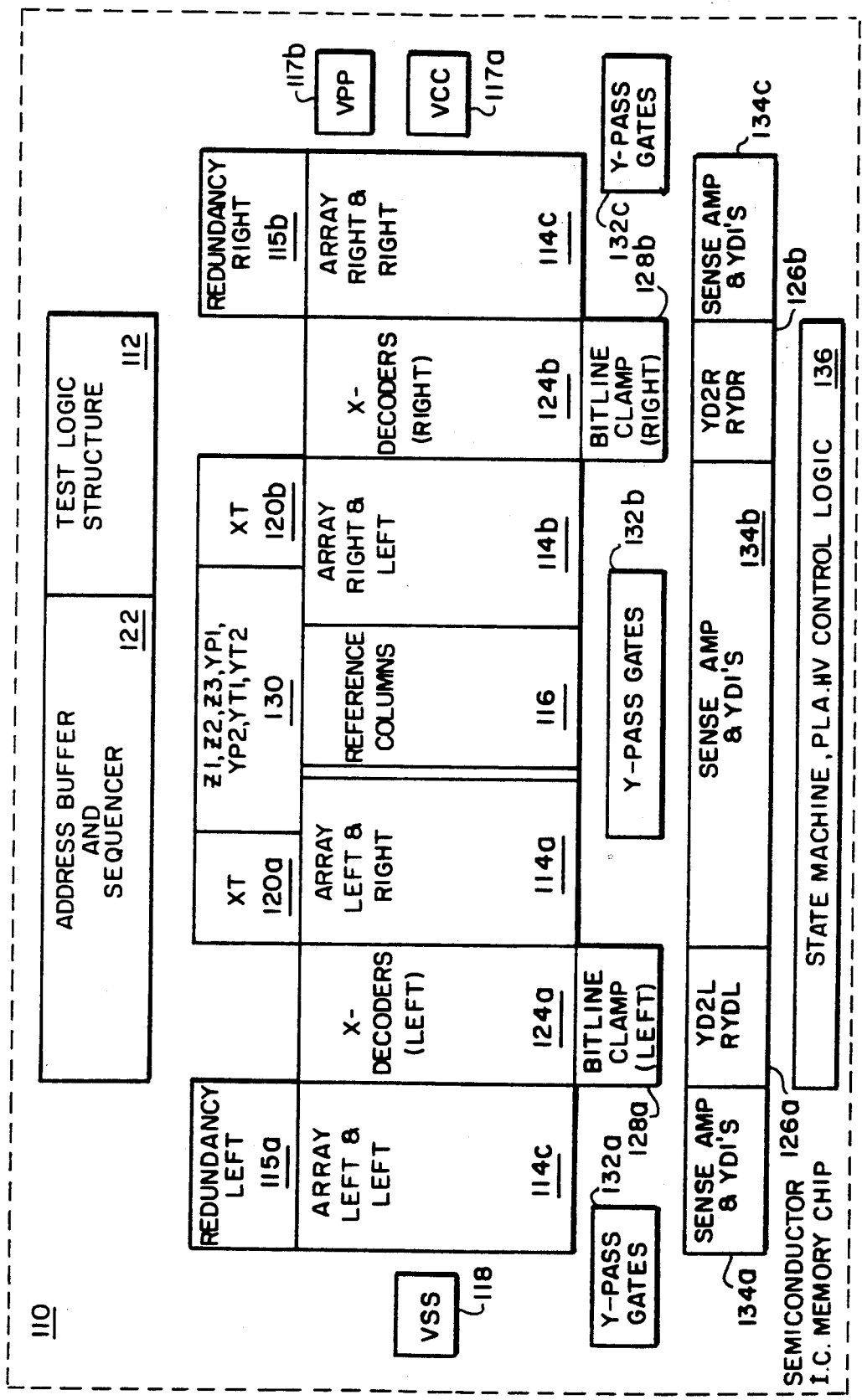
FIG. 1 is a block diagram showing the physical layout of a semiconductor integrated I.C. memory circuit device having a test logic structure, constructed in accordance with the principles of the present invention.

Referring now in detail to the drawings, there is illustrated in FIG. 1 a block diagram of the physical layout or organization of a semiconductor I.C. memory circuit device 110 having a test logic circuit structure 112 of the present invention for performing a measurement operation on memory arrays of the semiconductor memory circuit device. The memory device 110 includes four memory arrays 114a, 114b, 114c and 114d, each having 524,288 memory cells arranged in a regular matrix pattern of 1,024 rows and 512 columns. The memory array 114a (array left & right) and the memory array 114b (array right & left) combine to provide a 1M memory capacity (1,048,576 bits). Reference columns 116 are placed in the center between the memory arrays 114a and 114b, each reference column having 1,024 rows corresponding to the number of rows in the respective memory arrays 114a and 114b.

The memory array 114c (array left & left) is associated with first and second outputs of the memory device 110. The memory array 114a (array left & right) is associated with third and fourth outputs of the memory device. The memory array 114b (array right & left) is associated with fifth and sixth outputs of the memory device. The memory array 114d (array right & right) is associated with the seventh and eighth outputs of the memory device. Redundancy left circuit 115a and redundancy right circuit 115b function as control circuitry for replacing defective bits found in the memory arrays 114a through 114d. The memory circuit device 110 requires a first power supply voltage or supply potential 117a (VCC), a second or high supply potential 117b (VPP), and a ground potential 118 (VSS). The first supply potential VCC is typically at +5.0 volts ±10%, the second supply voltage VPP is typically at +12.0 volts 5%, and the ground potential VSS is typically at zero volts.

Further, the memory device 110 includes X pre1 decoders 120a, 120b and 130 (Z1-Z3), which receive row address signals via address buffer and sequencer circuitry 122, for driving row decoders 124a and 124b, respectively. There are also provided Y pre-decoders 126a, 126b and 130 (YP1, YP2, YT1, YT2) which receive column address signals via the address buffer 122, for driving the respective bit line clamps 128a and 128b. Adjacent the bit line clamps 128a and 128b, there is provided Y-pass gate circuitry 132a-132c for coupling the column address signals to the memory arrays 114a through 114d. Sense amplifier blocks 134a, 134b and 134c are located below the respective memory arrays 114c, 114a, 114b and 114d. Finally, a state machine, PLA, and HV control logic circuitry block 136 disposed below the sense amplifier block 134b is used for controlling the overall operation of the semiconductor memory device 110, including placing the memory arrays 114a and 114b in a floor test mode (FTM) through activation of the test logic circuitry 112, as will be explained more fully hereinafter.

Figure 2:
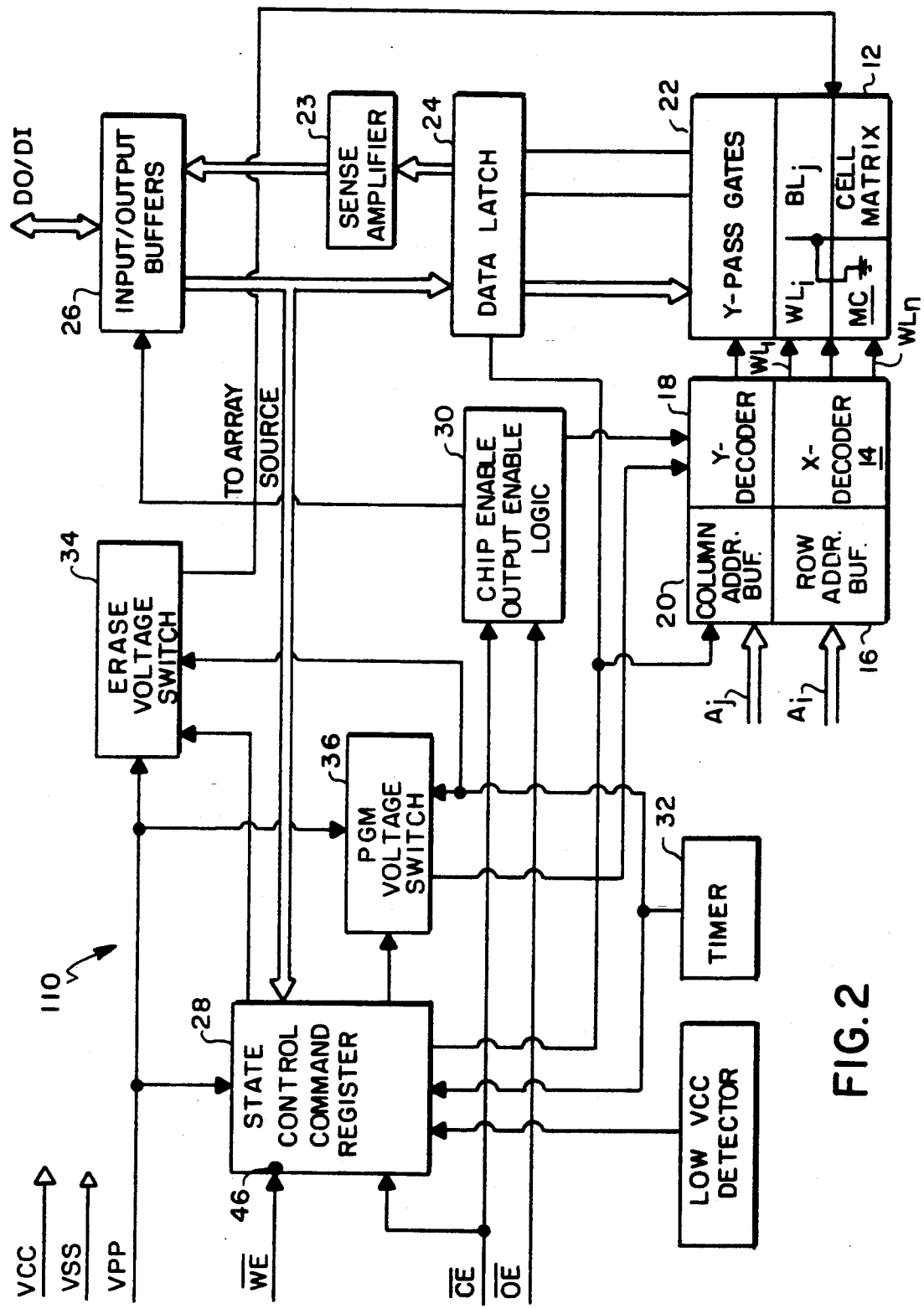
FIG. 2 is a simplified functional block diagram of the semiconductor memory circuit device of FIG. 1.

Referring now to FIG. 2, there is shown in simplified functional block diagram of the semiconductor memory circuit device 110 of FIG. 1. Further, for ease of illustration, the following explanations will be made primarily in connection with the semiconductor memory circuit device 110 of an electrically erasable programmable read-only memory (EEPROM) type. The test logic structure 110 and the remaining portions of the EEPROM memory circuit are both wholly formed on a single semiconductor substrate by known CMOS integrated circuit technology.

The EEPROM semiconductor memory circuit device 110 includes a cell matrix 12 formed of a plurality of memory cells MC (one of which is shown) arranged on the semiconductor chip. The cell matrix 12 is accessed by row address signals $A_i$ and column address signals $A_j$. The row address signals $A_i$ are fed to a row address decoder 14 via a row address buffer 16 including a latch circuit, for selecting one of the word lines $WL_1$-$WL_n$, i.e., $WL_i$. At the same time, the column address signals $A_j$ are fed to a column address decoder 18 via a column address buffer 20 including a latch circuit. The outputs of the column address decoder 18 are used to drive a Y-pass gate circuit 22 for selecting one of the bit lines $BL_1$-$BL_n$, i.e , $BL_j$.

The data stored in the selected memory cell MC is read by a sense amplifier 23 via the Y-pass gate circuit 22 and a data latch 24. The output of the sense amplifier 23 is used to drive the input/output buffers 26 for providing an output data DO. On the other hand, in a write mode, an input data DI is sent to the data latch 24 via the input/output buffer 26 and is then passed to the selected bit line via the Y-pass gate circuit 22.

The overall control of the read and write operations is achieved by a state control command register 28 and a chip enable/output enable logic circuit 30. The command register 28 receives a write enable signal $\overline{WE}$, a chip enable signal $\overline{CE}$, a power source high voltage VPP, and a timing signal from timer 32. The logic circuit 30 receives also the chip enable signal $\overline{CE}$ and an output enable signal $\overline{OE}$. The command register 28 and the logic circuit 30 provide a variety of control signals for an erase voltage switch 34, a PGM voltage switch 36, the input/output buffers 26, the data latch 24, and the column decoder 18. Further, some functions related to the overall operation of the memory array, not particularly relevant to the understanding of the operating principles of the present invention, have been purposely omitted for the sake of clarity.

Figure 3:
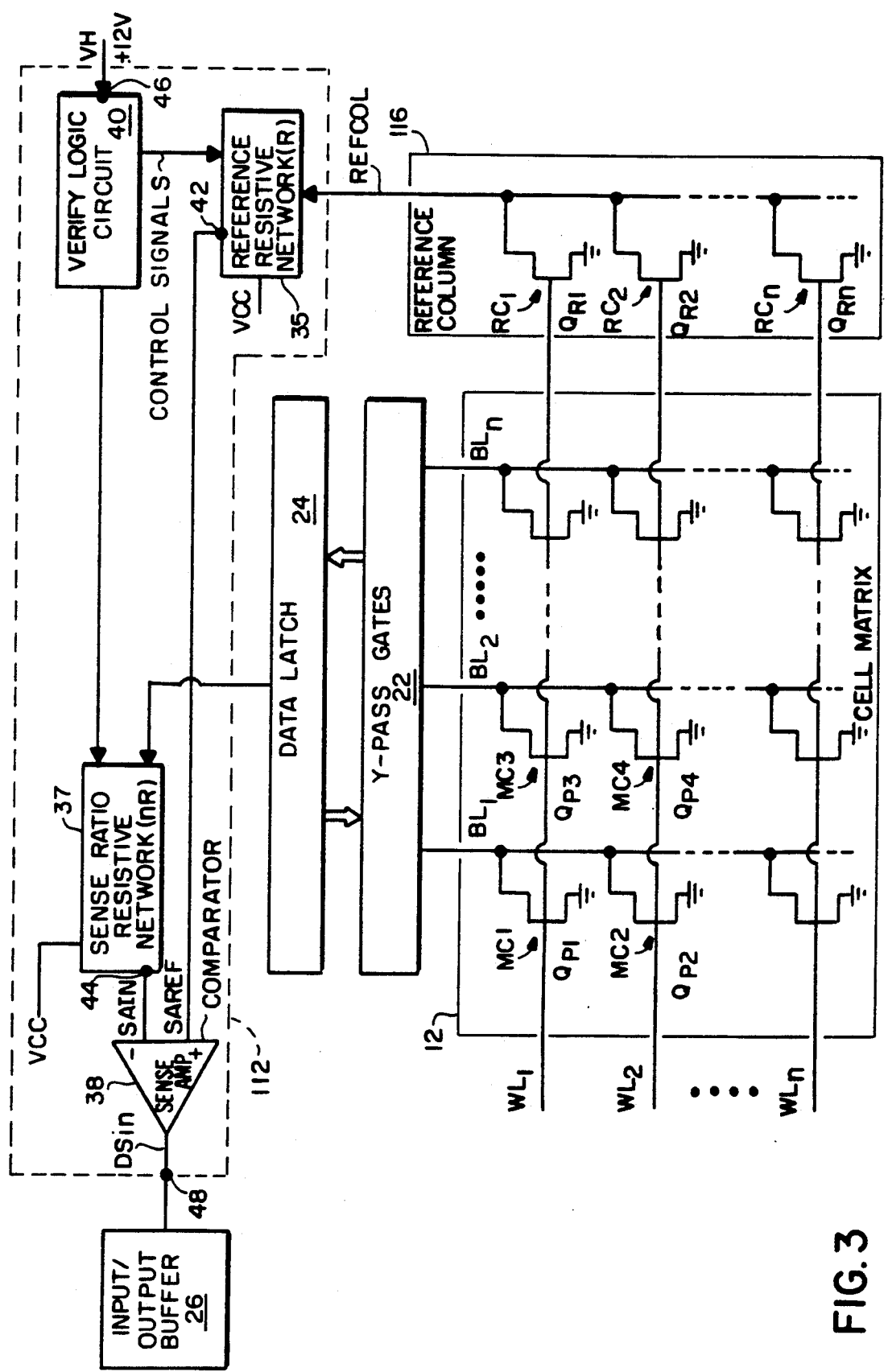
FIG. 3 is a simplified schematic circuit diagram of certain portions of the memory circuit device of FIG. 1 and the test logic structure.

In the aforementioned EEPROM type semiconductor memory circuit 110, the present invention is particularly concerned with the test logic structure 112 in relationship to the memory cells MC. Accordingly, a detailed explanation will be first given regarding the memory cell and then an explanation will be given concerning the test logic structure. In FIG. 3, there is illustrated a simplified schematic circuit diagram of certain portions of the memory circuit device of FIG. 2 and the test logic structure 112. As can be seen, the memory cells MC1 through MC4 are arranged in the form of a matrix. The cells MC1 and MC3 are arranged in the same row and have their selection terminals connected to the common word line $WL_1$. Similarly, the cells MC2 and MC4 are arranged in the same row and have their selection terminals connected to the common word line $WL_2$. Also, the cells MC1 and MC2 and the cells MC3 and MC4 are arranged in the same column and have their data terminals connected to the common bit line $BL_1$ and $BL_2$, respectively.

Each of the memory cells MC1 through MC4 is comprised of one of corresponding programming array transistors $Q_{P1}$ and $Q_{P4}$. The transistors $Q_{P1}-Q_{P4}$ function as a memory transistor for storing data "1" or "0" therein. Each of the programming array transistors $Q_{P1}-Q_{P4}$ have one of the respective threshold voltages $V_{TP1}-V_{TP4}$. The reference column 116 of FIG. 1 is comprised of a plurality of reference cells RC1, RC2, . . . RCn. Each of the reference cells RC1 through RCn is comprised of one of the corresponding reference cell transistors $Q_{R1}-Q_{Rn}$. The gates of the programming array transistors and the reference cell transistor located in the same row are connected to the same word line. For example, the gates of the transistors $Q_{P1}$, $Q_{P3}$ and $Q_{R1}$ are connected to the word line $WL_1$.

The test logic structure 112 (FIG. 3) is comprised of a comparator 38, a reference resistive network 35 having a resistance value R, a sense ratio resistive network 37 having a value of nR, and a verify logic circuit 40. The comparator 38 is actually one of the sense amplifiers 134b (23 in FIG. 2) associated with the left and right array 114a of FIG. 1. One end of the reference resistive network 35 is connected to a supply potential or voltage VCC, and the other end thereof is coupled to the common drain electrodes defining a reference column bit line of the reference cell transistors. The output terminal 42 of the reference resistive network 35 is connected to the noninverting input SAREF of the comparator 38. One end of the sense ratio resistive network 37 is also connected to the supply potential VCC, and the other end thereof is coupled to the common drain electrodes of the programming array transistors which are connected to the common bit line. The output terminal 44 of the sense ratio resistive network 37 is connected to the inverting input SAIN of the comparator 38. The sense ratio defined by the number n where n is greater than 1 during the normal mode of operation, i.e., 2.5:1 in the read mode.

In order to measure the threshold voltages $V_{TP1}$ through $V_{TPn}$ of the respective programming array transistors $Q_{P1}-Q_{Pn}$ to determine if any of them is negative without requiring the need of applying a negative supply voltage, it has been discovered that this can be achieved simply by changing the sense ratio to be less than one. Since it is a ratio that is important, the value of the reference resistive network 35 is actually the one which is changed in practice so as to obtain the sense ratio to be less than 1.

Assuming that the memory cell MC1 having the programming array transistor $Q_{P1}$ has been selected by the row and column address signals $A_i$ and $A_j$, the comparator 38 (sense amplifier) will effectively compare the threshold voltage $V_{TP1}$ of the programming array transistor $Q_{P1}$ to the threshold voltage $V_{TR1}$ of the reference cell transistor $Q_{R1}$. When the inputs SAIN and SAREF to the comparator 38 are equal, equation (1) expresses mathematically the relationship that exists between the threshold voltage of the memory array transistor and the threshold voltage of the reference cell transistor to be:

$$V_{TP} = (1 - 1/\sqrt{n}) \times V_{WL} + V_{TR}/\sqrt{n} \tag{1}$$

where
- n = the sense ratio
- $V_{wL}$ = the word line potential which is assumed to be equal to the reference cell transistor gate voltage
- $V_{TP}$ = the threshold voltage of the memory array transistor
- $V_{TR}$ = the threshold voltage of the reference cell transistor It will be noted that when the sense ratio n is less than 1 the sum of $(1-1/\sqrt{n})$ will always be less than zero. Also, when the sense ratio n is greater than 1 the sum of $(1-1/\sqrt{n})$ will always be greater than zero. Therefore, for any threshold voltage $V_{TP}$ of the memory array transistor which is less than the quantity $(1-1/\sqrt{n}) \times V_{WL} + V_{TR}/\sqrt{n}$, the comparator will output a logic "1" and for any threshold voltage $V_{TP}$ of the memory array transistor which is greater than the quantity $(1-1/\sqrt{n}) \times V_{WL} + V_{TR}/\sqrt{n}$, the comparator will output a logic "0". In other words, if the threshold voltage $V_{TP1}$ is greater than the threshold voltage $V_{TR1}$, then the output of the comparator 38 will be at a low or "0" logic level. On the other hand, if the threshold voltage $V_{TP1}$ is less than the threshold voltage $V_{TR1}$ indicating that $V_{TP1}$ is a negative value, then the output of the comparator 38 will be changed to a high or "1" logic level. Therefore, by merely monitoring the output of the comparator, it is possible to determine whether the programming array transistor has a negative threshold. By changing the address signals, it can be seen in this manner that the threshold voltages of each programming array transistor in the memory cells can be measured to determine if it has a negative value.

If the actual value of the threshold voltage $V_{TP}$ of the array transistor is required to be determined, this can be simply achieved by varying or sweeping the word line voltage $V_{WL}$ between a low voltage V1 and a high voltage V2 and by observing when the output of the comparator is changed from a low logic level to a high logic level or vice versa. The typical range for the voltages V1 and V2 is approximately from 2 volts to 8 volts. This word line voltage $V_{WL}$ at which the output of the comparator is changed is inserted into equation (1) above so as to calculate the actual value of the threshold voltage $V_{TP}$ of the array transistor. For example, at n=0.5, $V_{TR}=1.5$ V and $V_{WL}=6.0$ V when the comparator output switches. Then, plugging into equation (1), we have:

$$V_{TP} = (1 - 1/\sqrt{0.5}) \times 6.0 V + 1.5 V/\sqrt{0.5} \quad (2)$$

By simplifying, $V_{TP}= -0.364$ volts

Of course, if the desired threshold voltage $V_{TP}$ of the array transistor is already known then equation (1) can also be solved to determine the word line voltage $V_{WL}$. For instance, let n=0.5, $V_{TR}=1.5$ V and $V_{TP}=-1.0$ V. Then, plugging these values into equation (1), we have:

$$-1.0 V = (1 - 1/\sqrt{0.5}) \times V_{WL} + 1.5 V/\sqrt{0.5} \quad (3)$$

By solving for $V_{WL}$ and then simplifying,
$V_{WL}=7.536$ volts

Therefore, if the word line voltage $V_{WL}$ is varied between the range of 2 volts and 8 volts, the output of the comparator 38 would be switched from the logic "1" to the logic "0" at 7.536 volts.

While the reference column 116 of FIGS. 1 and 3 have been described to be comprised of the reference cell transistors $Q_{R1}-Q_{Rn}$ corresponding to the number of rows in the memory array, it should be understood to those skilled in the art that the reference column may alternatively be formed of a single reference transistor or any other number of transistors. Further, the gates of the reference cell transistors $Q_{R1}-Q_{Rn}$ need not be physically connected to the same word line voltages associated with the corresponding gates of the programming array transistors $Q_{P1}-Q_{Pn}$. All that is important is to have a known relationship which exists between the gate voltage of the reference cell transistor and the word line voltage of the array transistor (i.e., the two voltages are of equal potential or alternately, the reference cell transistor gate voltage is some fraction of the array transistor gate voltage). Equation (1) above was conveniently derived by assuming that the gate voltage of the reference cell transistor was equal to the word line voltage of the array transistor. It will be noted that a similar equation could be derived when the reference cell transistor gate voltage is some fraction of the array transistor gate voltage.

The verify logic circuit 40 is responsive to a high voltage VH (approximately +12.0 volts) applied to the input terminal 46 connected to receive the write enable signal $\overline{WE}$ (FIG. 1) for adjusting the sense ratio n to be less than one (i.e., 0.5:1) which is referred to as the "floor test mode." The verify logic circuit 40 generates on its output control signals PDPVB, PDEV PDPVO and FTMO which are fed to the reference resistive network 35. In the floor test mode, the values of the reference resistive network 35 will be changed or increased with respect to the sense ratio resistive network 37 so that the sense ratio n will be effected to be approximately 0.5:1.

While the various blocks 40, 37, 35 and 38 of FIG. 3 may take various forms, suitable circuitry therefor are illustrated in respective FIGS. 4 through 7. Even though these schematic circuit diagrams are believed to be self-explanatory to those skilled in the art in view of the foregoing description, a brief description of the operation of each is believed to be in order.

Figure 4:
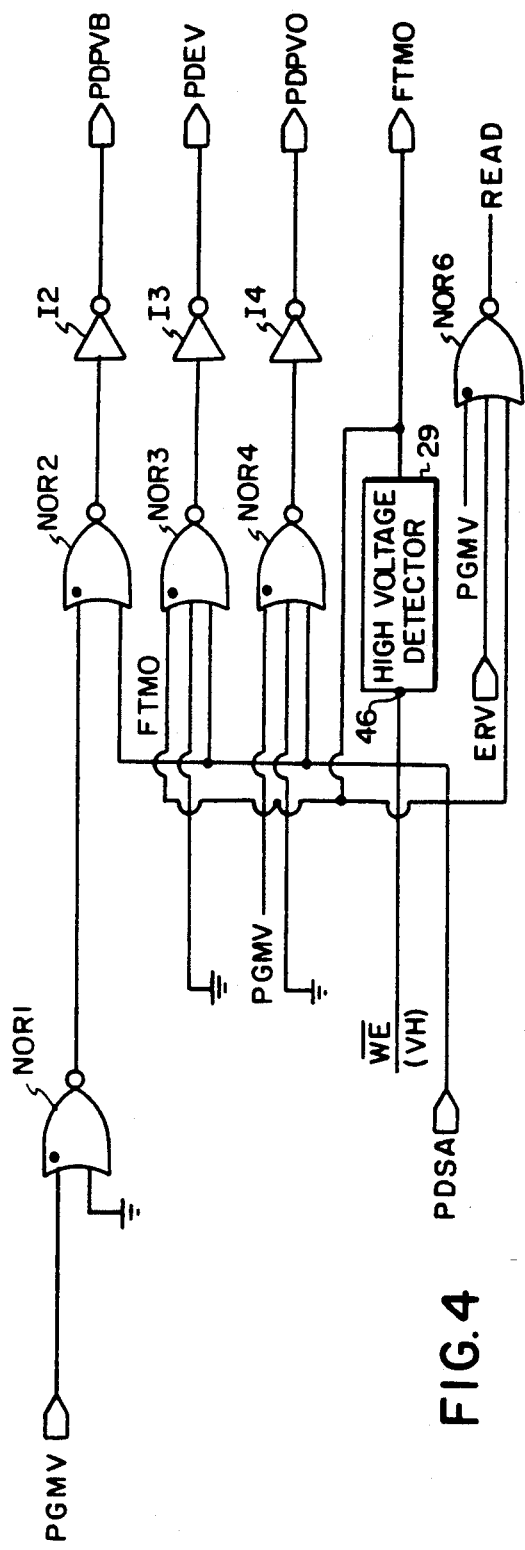
FIG. 4 is a schematic circuit diagram of the verify logic circuit of FIG. 3.

A schematic circuit diagram of the verify logic circuit 40 in FIG. 3 is illustrated in FIG. 4. The verify logic circuit receives input logic signals PGMV, READ, and ERV which are generated by the command register 28 (FIG. 1). The high voltage detector 29 has its input connected to receive the high voltage VH applied to the input terminal 46. In response to these input signals, the verify logic circuit produces output logic control signals PDPvB, PDEV, PDPVO and FTMO. In the Table listed below, there is shown the respective logic levels of the output control signals and the corresponding sense ratio n for the various modes of operation, such as modes: read mode READ, program verify mode PGMV, erase verify mode ERV, and floor test mode FTM.

TABLE

| MODE | PDPVB | PDEV | PDPVO | FTMO | n |
|------|-------|------|-------|------|-----|
| READ | 1 | 0 | 0 | 0 | 2.5 |
| PGMV | 0 | 0 | 1 | 0 | 4.0 |
| ERV | 1 | 0 | 0 | 0 | 2.5 |
| FTM | 1 | 1 | 0 | 1 | 0.5 |

The verify logic circuit includes NOR logic gates NOR2-NOR6 and inverters I2-I4. The inputs of the respective inverters I2-I4 are connected to the outputs of the corresponding logic gates NOR2-NOR4. The outputs of the inverters I2-I4 and the high voltage detector 29 provide the output control signals PDPVB, PDEV, PDPVO and FTMO. It will be noted that during normal operations, i.e., the modes READ, PGMV and ERV, the sense ratio is greater than one. During the floor test mode FTM in which the threshold voltages VT's of the memory cell transistors $Q_{P1}-Q_{Pn}$ are measured to determine if they are less than the reference cell threshold voltages of the transistors $Q_{R1}-Q_{Rn}$, the sense ratio is changed to be less than one, i.e., 0.5. This is effected by applying a high voltage VH, which does not appear during normal operations, to the input terminal 46 ($\overline{WE}$) of the command register 28. As a result, the logic levels of the output logic control signals will be PDPVB=1, PDEV=1, PDPVO=0 and FTMO=1.

Figure 5:
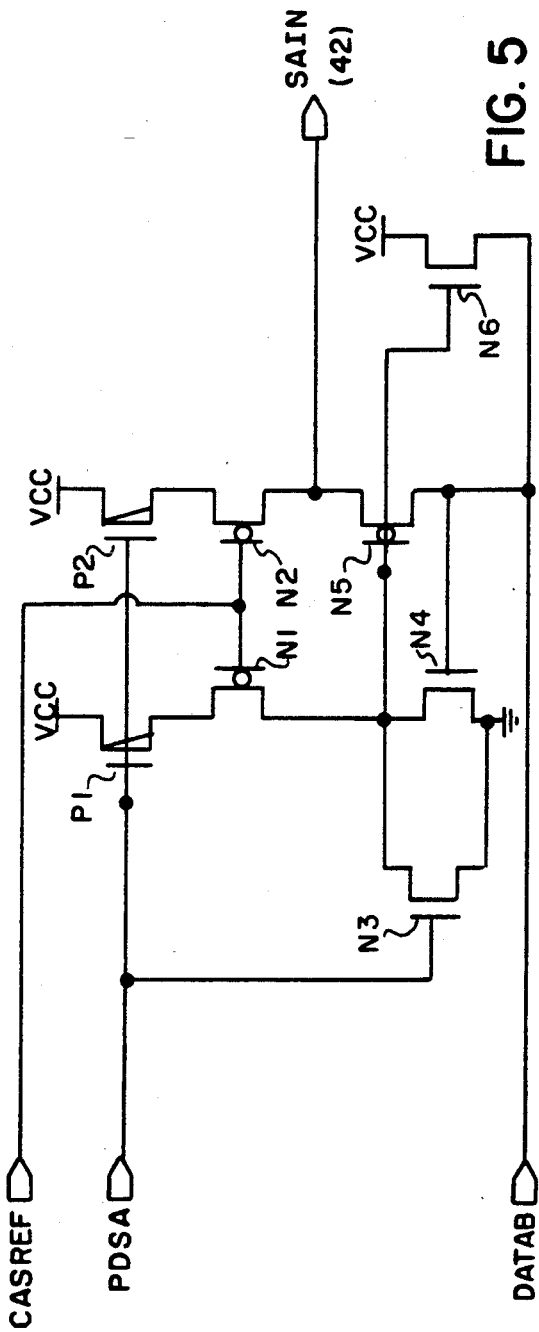
FIG. 5 is a schematic circuit diagram of the sense ratio resistive network of FIG. 3.

A schematic circuit diagram of the sense ratio resistive network 37 having a value of nR is depicted in FIG. 5. The sense ratio resistive network 37 is comprised of P-channel MOS transistors P1, P2 and N-channel MOS transistors N1-N6. The resistance value of the network 37 is determined by the transistor N2 whose source is connected to the inverting input SAIN (44) of the comparator 38. The gate of the transistor N2 receives a reference voltage CASREF, which is less than the supply voltage VCC, which is typically +5.0 volts ±10%. The gates of the transistors P1 and P2 are connected to the power down signal PDSA, which is used to turn off the same during a power down mode in order to reduce power consumption. The node DATAB corresponds to the lower end of the network 37 and is connected to the common drains of the programming array transistors which are tied to the same bit line. The transistors N3–N6 are used for level shifting so as to maintain the node DATAB at a predetermined value during the floor test mode (FTM), read mode (READ), program verify mode (PGMV), and erase verify mode (ERV), i.e., +1.3 volts.

Figure 6:
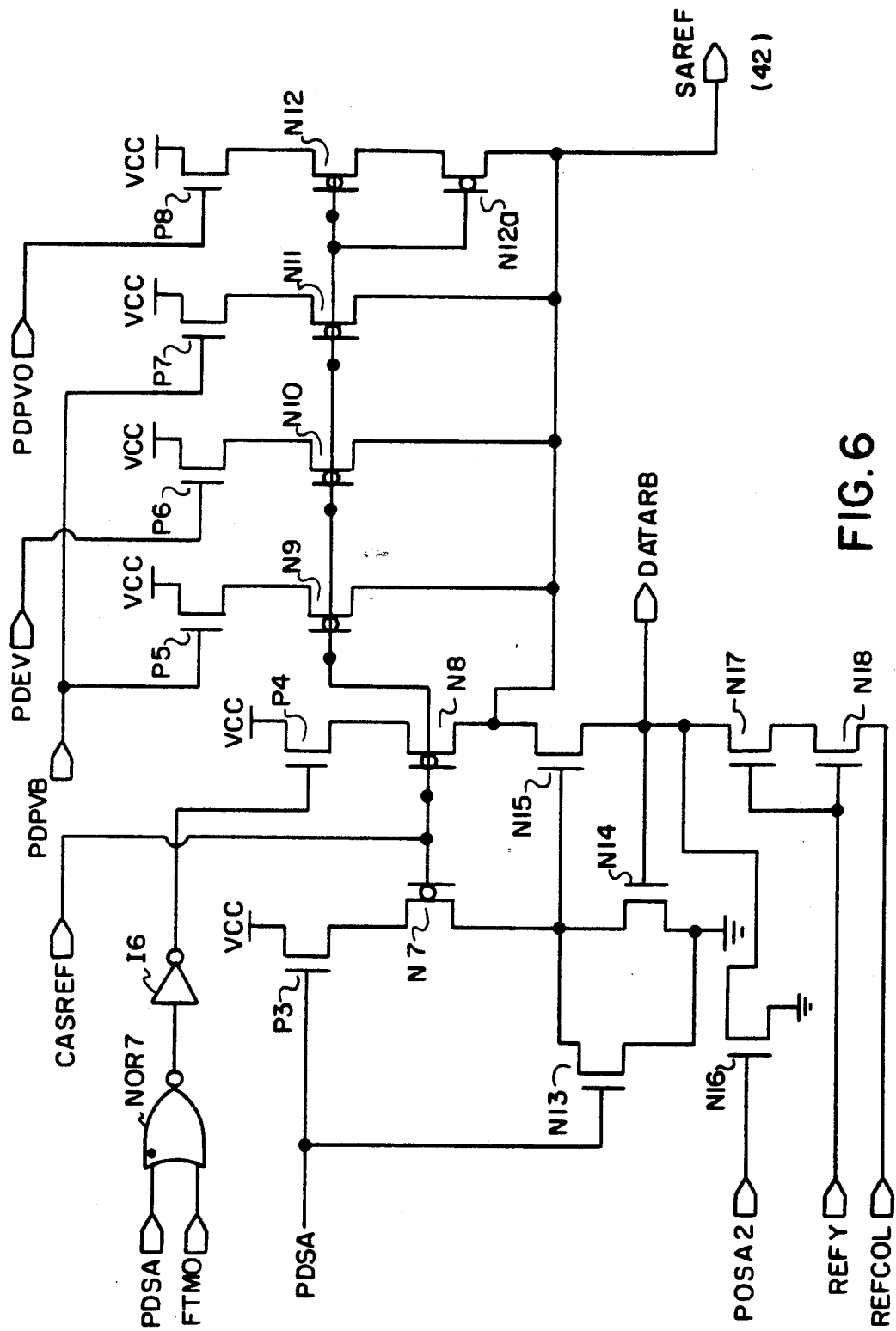
FIG. 6 is a schematic circuit diagram of the reference resistive network of FIG. 3.

A schematic circuit diagram of the reference resistive network 35 is shown in FIG. 6. The network 35 is comprised of NOR logic gate NOR7, inverter 16, P-channel MOS transistors P3–P8, N-channel MOS transistors N7–N11, and series-connected transistors N12 and N12a. The resistance value of the network 35 is determined by the transistors N8–N11 and the series-connected transistors N12 and N12a. The sizes of the transistors N8 through N12a re preferably made to be equal to the size of transistor N2 in the sense ratio resistive network 35 (FIG. 5).

During the floor test mode FTM, the control signal PDPVO will be at a low or "0" logic level which will render the transistor P8 to be conductive. The transistor P4–P7 will be non-conductive since the gate signals FTMO, PDPVO and PDEV are at a high or "1" logic level. As a result, the resistance will be determined by the series connected transistors N12 and N12a. Due to the series connection of these transistors N12 and N12a, the resistance at the node 42 connected to the noninverting input SAREF of the comparator 38 will be increased so that the sense ratio n ($R_{37}/R_{35}$) will be approximately 0.5. The node REFCOL corresponds to the lower end of the network 35 and is connected to the common drains of the reference column transistors $Q_{R1}$–$Q_{Rn}$ which are tied to the reference column bit line. Similarly, the gate of the transistor N8 is connected to the reference voltage CASREF, and the gate of the transistor P3 is connected to the power down signal PDSA.

Figure 7:
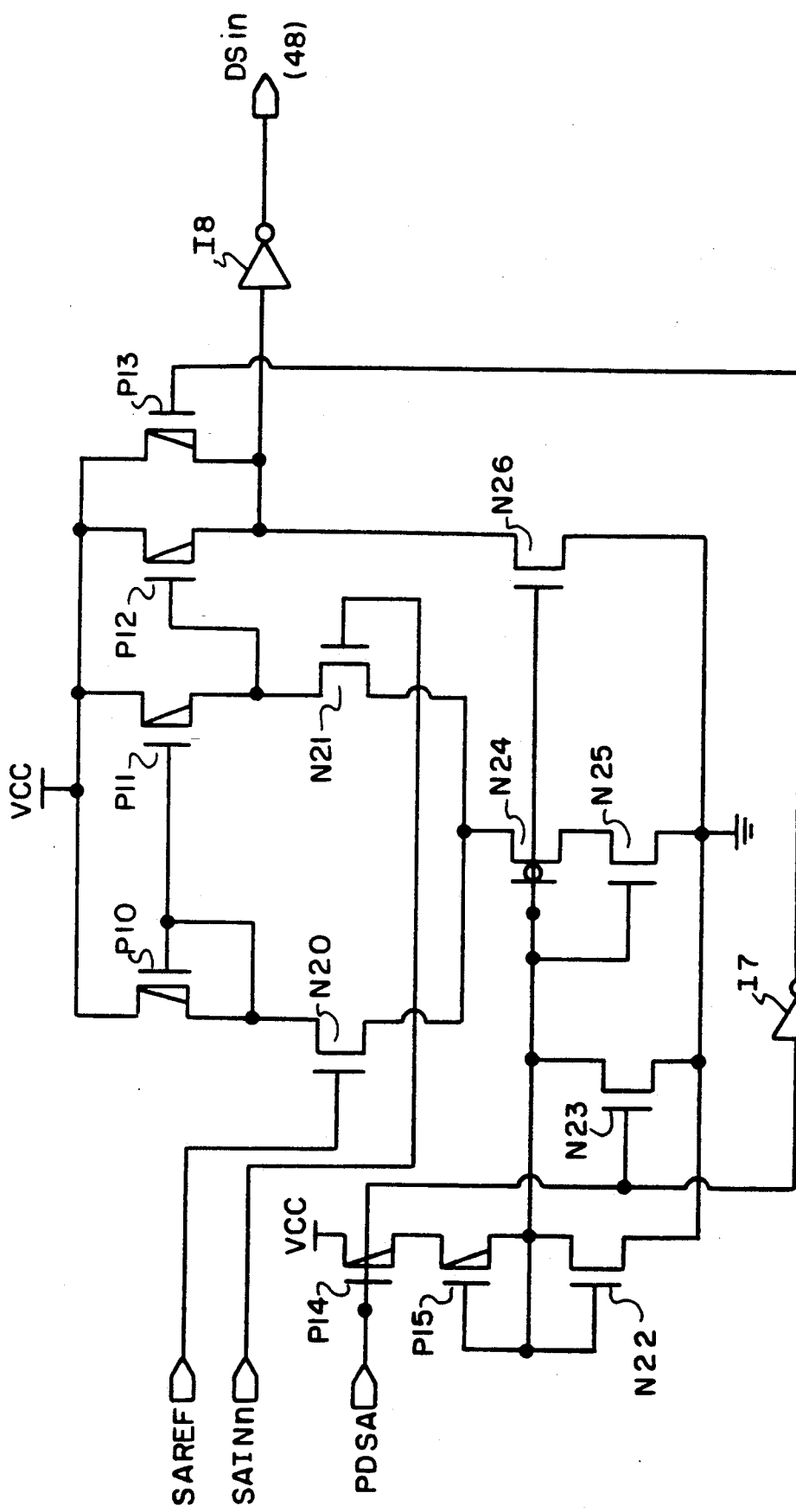
FIG. 7 is a schematic circuit diagram of the sense amplifier of FIG. 3.

A schematic circuit diagram of the comparator 38 is illustrated in FIG. 7. The comparator is comprised of inverters I7, I8, P-channel transistors P10–P15, and Nchannel MOS transistors N20–N26. The transistors P14, P15 and N22 form a reference generator supplying a voltage to the gates of the current source transistors N24 and N25. The transistors N20 and N21 define the two differential input transistors and the transistors P10 and P11 serve as loads for respective input transistors N20 and N21. The transistor P12, whose gate is connected to the drain of the input transistor N21 and whose drain is connected to the input of the inverter I8, forms an inverting amplifier with load transistor N26. The output of the inverter I8 defining the output of the comparator is connected to an output pad 48 for providing an output test signal DSin.

In the normal modes of operation (i.e., READ, PGMV and ERV), the high voltage VH is not applied to the input terminal 46 ($\overline{WE}$) of the command register 28 and the logic levels of the output control signals PDPVB, PDEV, PDPVO and the sense ratio n have the ones shown in the above Table. As usual, the address signals $A_i$, $A_j$ are supplied to the row and column decoders 14, 18 through the respective address buffers 16, 20 so that data can be written and read from the various memory cells MC in the cell matrix 12 (FIG. 2).

In the floor test mode FTM, the threshold voltages $V_T$'s each of the programming array transistors $Q_{P1}$ through $Q_{Pn}$ will be measured to determine if it is at a negative value without applying a negative supply voltage. This is accomplished by comparing the threshold voltages of each of the programming array transistors with the threshold voltage of the reference cell transistors. Assume that the address signals applied to the row and column decoders 14, 18 address the memory cell MC1. This will cause the comparator 38 to compare the threshold voltage of the programming array transistor $Q_{P1}$ with the threshold voltage of the reference cell transistor $Q_{R1}$. Typically, the threshold voltage of the reference cell transistor $Q_{R1}$ will be at approximately 1.0 volts and the threshold voltage of the programming array transistor $Q_{P1}$ will be at approximately 1.3 volts in the "erased" condition.

When the threshold voltage $V_{TP1}$ is greater than the threshold voltage $V_{TR1}$, the voltage at the inverting input SAIN (node 44) of the comparator 38 will be higher than the voltage at the non-inverting input SAREF (node 42) of the comparator. This will cause the output signal DSin at the output of the comparator to have a low logic level at the node 48 (DSin=0). On the other hand, when the threshold voltage $V_{TP1}$ is less than the threshold voltage $V_{TR1}$ indicating that the programming array transistor $Q_{P1}$ has a negative value, the voltage at the inverting input SAIN will be lower than the voltage at the non-inverting input SAREF. Consequently, this will cause the output signal of the comparator to have a high logic level at the node 48 (DSin=1). By addressing each of the memory cells MC2 through MCn in the cell matrix 12, it can be determined if any of the programming array transistors in the cell matrix have a negative value.

The test logic circuit structure of the present invention has the following advantages over the prior art designs:

(a) it allows the measurement of negative threshold voltages of the programming array transistors or determining whether the threshold voltages of the programming array transistors are less than the threshold voltages of the reference cell transistors without applying negative voltages;

(b) it allows for high speed measurement without the use of a parametric tester; and (c) it allows adjustment of the sense ratio or the voltage on the word line so as to determine the threshold voltages of the programming array transistors.

From the foregoing detailed description, it can thus be seen that the present invention provides a test logic circuit structure used in a semiconductor memory of an EEPROM type for measuring the threshold voltage of an array cell transistor which is less than the threshold voltage of a reference cell transistor without requiring the use of negative supply potentials. The test logic circuit structure of the present invention includes a first resistance network, a second resistance network, and verify logic circuitry for switching ratio of the values of the first resistive network to the second resistive network to be less than one during a floor test mode so as to permit measurement of the threshold voltage of the programming array transistor which is less than the threshold voltage of the reference cell transistor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor memory circuit device having a test logic structure for forming a measurement on the memory circuit device without requiring a negative supply potential, said test logic structure comprising in combination:

a cell matrix (12) having a plurality of memory cells (MC) arrayed in rows of word lines and columns of bit lines intersecting said rows of word lines, each of said memory cells including a programming array transistor ($Q_P$) having an array threshold voltage;

row decoder means (14) responsive to row address signals and being operatively connected to said cell matrix for selecting one of said rows of word lines;

column decoder means (18) responsive to column address signals and being operatively connected to said cell matrix for selecting one of said columns of bit lines;

reference column means (116) including a plurality of reference cells (RC) arrayed in rows of word lines corresponding to the number of rows in said cell matrix, each of said reference cells including a reference cell transistor ($Q_R$) having a reference threshold voltage;

verify logic means (40) responsive to a high voltage for placing said cell matrix in a floor test mode;

sense ratio resistive network means operatively connected to said columns of bit lines for generating a first resistance value corresponding to the array threshold voltage of the programming array transistor;

reference resistive network means operatively connected to said reference column means for generating a second resistance value corresponding to the reference threshold voltage of the reference cell transistor; and comparator means (38) having a first input coupled to said sense ratio resistive network means and a second input coupled to said reference resistive network means for comparing the array threshold voltage of the programming array transistor and the reference threshold voltage of the reference cell transistor and for generating a logic signal which is at a low logic level when said array threshold voltage is greater than said reference threshold voltage and which is at a high logic level when said array threshold voltage is less than said reference threshold voltage.

2. In a semiconductor memory circuit device as claimed in claim 1, wherein the ratio of said first resistance value to said second resistance value is defined to be a sense ratio which is changed from a number greater than one to a number less than one in the floor test mode.

3. In a semiconductor memory circuit device as claimed in claim 2, wherein said reference resistive network means (35) is responsive to control signals generated by said verify logic means (40) for increasing the second resistance value relative to the first resistance value so as to obtain the sense ratio of less than one.

4. In a semiconductor memory circuit device as claimed in claim 3, wherein said comparator means (38) comprises sense amplifier means.

5. In a semiconductor memory circuit device as claimed in claim 4, wherein said sense amplifier means has an inverting input defining the first input of said comparator means and a non-inverting input defining the second input of said comparator means, and an output for providing the logic signal.

6. In a semiconductor memory circuit device as claimed in claim wherein said programming array transistor ($Q_P$) has its gate connected to one of said rows of word lines, its drain coupled to one of said columns of bit lines, and its source connected to a ground potential.

7. In a semiconductor memory circuit device as claimed in claim 6, wherein said reference cell transistor ($Q_R$) has its gate connected to the same one of said rows of word lines, its drain coupled to a reference bit line, and its source connected to the ground potential.

8. In a semiconductor memory circuit device as claimed in claim 5, further comprising an output terminal (48) coupled to the output of said sense amplifier means (38) for providing the logic signal.

9. In a semiconductor memory circuit device having a test logic structure for forming a measurement on the memory circuit device without requiring a negative supply potential, said test logic structure comprising in combination:

a cell matrix (12) having a plurality of memory cells (MC) arrayed in rows of word lines and columns of bit lines intersecting said rows of word lines, each of said memory cells including a programming array transistor ($Q_P$) having an array threshold voltage;

row decoder means (14) responsive to row address signals and being operatively connected to said cell matrix for selecting one of said rows of word lines;

column decoder means (18) responsive to column address signals and being operatively connected to said cell matrix for selecting one of said columns of bit lines;

reference column means (116) including a plurality of reference cells (RC) arrayed in rows of word lines corresponding to the number of rows in said cell matrix, each of said reference cells including a reference cell transistor (QR) having a reference structural voltage;

Y-pass gate means (22) operatively connected to said columns of bit lines;

sense amplifier means (38) operatively connected to said Y-pass gate means;

first resistive network means operatively connected to said columns of bit lines and to a first input of said sense amplifier means;

second resistive network means (35) operatively connected to a reference column bit line and to a second input of said sense amplifier means; and verify logic means (40) for switching the ratio of the value of the first resistive network means to the value of the second resistive network means defining a sense ratio to be less than one during a floor test mode so as to permit measurement of the threshold voltage of the programming array transistor which is less than the threshold voltage of the reference cell transistor.

10. In a semiconductor memory circuit device as claimed in claim 9, wherein said reference resistive network means (35) is responsive to control signals generated by said verify logic means (40) for increasing the resistance value of said second resistive network means relative to the resistance value of said first resistive network means so as to obtain the sense ratio of less than one.

11. In a semiconductor memory circuit device as claimed in claim 9, wherein said programming array transistor ($Q_P$) has its gate connected to one of said rows of word lines, its drain coupled to one of said columns of bit lines, and its source connected to a ground potential.

12. In a semiconductor memory circuit device as claimed in claim wherein said reference cell transistor ($Q_R$) has its gate connected to the same one of said rows of word lines, its drain ooupled to a reference bit line, and its source connected to the ground potential.

13. In a semiconductor memory circuit device having a test logic structure for forming a measurement on the memory circuit device without requiring a negative supply potential, said test logic structure comprising in combination:

a cell matrix (12) having a plurality of memory cells (MC) arrayed in rows of word lines and columns of bit lines intersecting said rows of word lines, each of said memory cells including a programming array transistor ($Q_P$) having an array threshold voltage;

row decoder means (14) responsive to row address signals and being operatively connected to said cell matrix for selecting one of said rows of word lines;

column decoder means (18) responsive to column address signals and being operatively connected to said cell matrix for selecting one of said columns of bit lines;

reference column means (116) including a reference cell transistor ($Q_R$) having a reference threshold voltage;

verify logic means (40) responsiye to a high voltage for placing said cell matrix in a floor test mode;

sense ratio resistive network means operatively connected to said columns of bit lines for generating a first resistance value corresponding to the array threshold voltage of the programming array transistor;

reference resistive network means operatively connected to said reference column means for generating a second resistance value corresponding to the reference threshold voltage of the reference cell transistor; and comparator means (38) having a first input coupled to said sense ratio resistive network means and a second input coupled to said reference resistive network means for comparing the array threshold voltage of the programming array transistor and the reference threshold voltage of the reference cell transistor and for generating a logic signal which is at a low logic level when said array threshold voltage is greater than said reference threshold voltage and which is at a high logic level when said array threshold voltage is less than said reference threshold voltage.

14. In a semiconductor memory circuit device as claimed in claim 13, wherein the ratio of said first resistance value to said second resistance value is defined to be a sense ratio which is changed from a number greater than one to a number less than one in the floor test mode.

15. In a semiconductor memory circuit device as claimed in claim 14, wherein said reference resistive network means (35) is responsive to control signals generated by said verify logic means (40) for increasing the second resistance value relative to the first resistance value so as to obtain the sense ratio of less than one.

16. In a semiconductor memory circuit device as claimed in claim 15, wherein said comparator means (38) comprises sense amplifier means.

17. In a semiconductor memory circuit device as claimed in claim 16, wherein said sense amplifier means has an inverting input defining the first input of said comparator means and a non-inverting input defining the second input of said comparator means, and an output for providing the logic signal.

18. In a semiconductor memory circuit device as claimed in claim 1, wherein said programming array transistor ($Q_P$) has its gate connected to one of said rows of word lines for reoeiving an array transistor gate voltage, its drain coupled to one of said columns of bit lines, and its source connected to a ground potential.

19. In a semiconductor memory circuit device as claimed in claim 18, wherein said reference cell transistor ($Q_R$) has its gate connected to a reference cell gate voltage having a predetermined relationship to said array transistor gate voltage, its drain coupled to a reference bit line, and its source connected to the ground potential.

20. In a semiconductor memory circuit device as claimed in claim 17, further comprising an output terminal (48) coupled to the output of said sense amplifier means (38) for providing the logic signal.

* * * * *

UNITED STATES PATENT AND TRADEMARK OFFICE
CERTIFICATE OF CORRECTION

PATENT NO. : 5,142,496
DATED : August 25, 1992
INVENTOR(S) : Michael A. VanBuskirk It is certified that error appears in the above-identified patent and that said Letters Patent is hereby corrected as shown below:

Column 1, line 28, "IM", should be --1M--.
         line 67, "turn-o off", should be --turn-off--.

Column 2, line 6, "IM", should be --1M--.

Column 4, line 18, after "volts", insert --±--.
         line 20, "prel", should be -- pre- --.

Column 5, lines 32, 33, 38 and 42, "MCI", should be --MC1--.

Column 6, line 41, "$V_{wL}$", should be --$V_{WL}$--.
         line 50, "√n", should be -- $\sqrt{n}$ --.
         line 53, "$V_{wl}$", should be --$V_{WL}$--.

Column 8, line 22, "PDPvB", should be --PDPVB--.

UNITED STATES PATENT AND TRADEMARK OFFICE
CERTIFICATE OF CORRECTION

PATENT NO. : 5,142,496
DATED : August 25, 1992
INVENTOR(S) : Michael A. VanBuskirk It is certified that error appears in the above-identified patent and that said Letters Patent is hereby corrected as shown below:

Column 12, line 13, after "claim", insert --1--.
          line 49, "QR", should be --$Q_R$--.

Column 13, line 17, after "claim", insert --11--.

Column 14, line 41, "reoeiving", should be --receiving--.

Signed and Sealed this

Nineteenth Day of October, 1993

Attest:

BRUCE LEHMAN

Attesting Officer      Commissioner of Patents and Trademarks